US008890303B2

(12) United States Patent
Tan et al.

(10) Patent No.: US 8,890,303 B2
(45) Date of Patent: Nov. 18, 2014

(54) THREE-DIMENSIONAL INTEGRATED CIRCUIT

(71) Applicant: National Chiao Tung University, Hsinchu (TW)

(72) Inventors: An-Nan Tan, Hsinchu (TW); Hung-Ming Chen, Hsinchu County (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 13/831,150

(22) Filed: Mar. 14, 2013

(65) Prior Publication Data
US 2014/0175632 A1    Jun. 26, 2014

(30) Foreign Application Priority Data
Dec. 26, 2012   (TW) .............................. 101150247 A

(51) Int. Cl.
| | |
|---|---|
| H01L 23/36 | (2006.01) |
| H01L 23/367 | (2006.01) |
| H01L 23/48 | (2006.01) |
| H01L 25/065 | (2006.01) |
| H01L 23/42 | (2006.01) |

(52) U.S. Cl.
CPC .............. *H01L 23/36* (2013.01); *H01L 23/367* (2013.01); *H01L 23/481* (2013.01); *H01L 25/0657* (2013.01); *H01L 23/3677* (2013.01); *H01L 23/42* (2013.01)
USPC ........... 257/692; 257/777; 257/774; 257/773; 257/686; 257/685; 257/723; 257/728

(58) Field of Classification Search
USPC ......... 257/692, 777, 774, 773, 686, 685, 723, 257/728
See application file for complete search history.

(56) References Cited

U.S. PATENT DOCUMENTS

| | | | | |
|---|---|---|---|---|
| 3,266,045 | A | * | 8/1966 | Schaffert ........................ 430/50 |
| 7,369,589 | B2 | * | 5/2008 | Lorenzen ........................ 372/36 |
| 2008/0045879 | A1 | * | 2/2008 | Prausnitz et al. ............... 604/20 |

FOREIGN PATENT DOCUMENTS

TW            201005917            2/2010

OTHER PUBLICATIONS

Sekar et al., "A 3D-IC Technology with Integrated Microchannel Cooling," International Interconnect Technology Conference (IITC), Jun. 1-4, 2008, pp. 13-15.
Li et al., "Efficient Thermal via Planning Approach and Its Application in 3-D Floorplanning," IEEE Transactions on Computer-Aided Design of Integrated Circuits and Systems 26(4), Apr. 2007, pp. 645-658.
An-Nan Tan, "On Exploration and Simulation for the Placement of Inter-Stratum Thermal Pad and Thermal Through Silicon Via in 3-D IC," Master's Thesis, National Chiao Tung University, College of Electrical and Computer Engineering, Jun. 2012, pp. 1-41.

* cited by examiner

*Primary Examiner* — Alexander Oscar Williams
(74) *Attorney, Agent, or Firm* — Jianq Chyun IP Office

(57) ABSTRACT

A three-dimensional integrated circuit, including a first adhesive bonding layer, a first chip, a second chip, and an inter-stratum thermal pad, is provided. The first adhesive bonding layer has a first surface and a second surface opposite to each other. The first chip is disposed on the first surface of the first adhesive bonding layer. The first chip includes a hot zone. The second chip is disposed on the second surface of the first adhesive bonding layer. The inter-stratum thermal pad is embedded in the first adhesive bonding layer and faces to the hot zone.

14 Claims, 4 Drawing Sheets

THREE-DIMENSIONAL INTEGRATED CIRCUIT

CROSS-REFERENCE TO RELATED APPLICATION

This application claims the priority benefit of Taiwan application serial no. 101150247, filed on Dec. 26, 2012. The entirety of the above-mentioned patent application is hereby incorporated by reference herein and made a part of this specification.

BACKGROUND OF THE INVENTION

2. Field of the Invention

The invention relates to a three-dimensional integrated circuit and particularly relates to a three-dimensional integrated circuit different from the conventional structure.

2. Description of Related Art

In recent years, the electronic industry develops and prospers with the guidance of Moore's Law. However, with the increasing demand for higher operation speed of electronic products (e.g. portable electronic devices), technical challenges gradually emerge. In order to improve the functions of portable electronic devices to meet the demand, the technology of three-dimensional integrated circuit (3D IC) integration has been proposed as one of the solutions for developing portable electronic devices to be small-sized, highly efficient, multi-functional, and low power consuming, and low-cost.

The interconnection between chips is typically achieved using through-silicon via (TSV) technology, which is to manufacture vertical through vias passing through chips or wafers. It is the new 3D IC integration technology that accomplishes interconnection between the chips. Different from the conventional IC package technology and salient point stacking technology, the TSV technology achieves the greatest density of stacking chips in three-dimensional directions, has the smallest size, improves the speed of the devices, reduces signal delay, and suppresses power consumption. Therefore, TSV is the key technology for 3D IC integration.

For a three-dimensional integrated circuit that is mainly formed by stacking different wafers (or chips), the stack structure increases the overall heat resistance. Consequently, a heating phenomenon occurs when the three-dimensional integrated circuit is operated, which results in the increase of working temperature and decrease of reliability of the three-dimensional integrated circuit.

Two or more chips may be fixed to each other through an adhesive, which forms an adhesive bonding layer between the chips. However, the adhesive bonding layer has low thermal conductivity and reduces the heat dissipation efficiency of the three-dimensional integrated circuit. According to the current technology, a thermal TSV is used to dissipate the heat from the hot zone. Nevertheless, in the structure of the current three-dimensional integrated circuit, the thermal TSV is configured beside the hot zone and thus achieves very limited heat dissipation. In addition, microchannel cooling may also be utilized to dissipate the heat of the hot zone. However, the microchannel cooling has a larger structure and is not suitable for portable electronic devices.

SUMMARY OF THE INVENTION

The invention provides a three-dimensional integrated circuit that has better heat dissipation efficiency.

The invention provides a three-dimensional integrated circuit, including a first adhesive bonding layer, a first chip, a second chip, and an inter-stratum thermal pad. The first adhesive bonding layer includes a first surface and a second surface opposite to each other. The first chip is disposed on the first surface of the first adhesive bonding layer. The first chip includes a hot zone. The second chip is disposed on the second surface of the first adhesive bonding layer. The inter-stratum thermal pad is embedded in the first adhesive bonding layer and faces to the hot zone.

In an embodiment of the invention, a material of the inter-stratum thermal pad is a material that has a high coefficient of thermal conductivity, which is at least equal to a coefficient of thermal conductivity of a first substrate of the first chip.

In an embodiment of the invention, the material of the inter-stratum thermal pad includes copper.

In an embodiment of the invention, the three-dimensional integrated circuit further includes at least one first thermal via. Each first thermal via penetrates the first adhesive bonding layer and the second chip and is located in a portion of the inter-stratum thermal pad.

In an embodiment of the invention, the first thermal via is disposed to face right to the hot zone.

In an embodiment of the invention, the first chip includes a first substrate. The first thermal via penetrates the first substrate and is located near the hot zone.

In an embodiment of the invention, the first chip further includes a first element layer, a first metal layer, and a first dielectric layer. The first element layer has a first surface and a second surface opposite to each other, and the hot zone is located in the first element layer. The first substrate is disposed on the second surface of the first element layer. The first metal layer is disposed on the first surface of the first element layer. The first dielectric layer is disposed on the first substrate and located beside the first element layer and the first metal layer.

In an embodiment of the invention, the second chip includes a second element layer, a second metal layer, a second substrate, and a second dielectric layer. The second element layer has a first surface and a second surface opposite to each other. The second metal layer is disposed on the first surface of the second element layer. The second substrate is disposed on the second surface of the second element layer. The second dielectric layer is disposed on the second substrate and located beside the second element layer and the second metal layer.

In an embodiment of the invention, the first chip and the second chip are electrically connected with each other by a through-silicon via technique.

In an embodiment of the invention, the three-dimensional integrated circuit further includes a third chip and a second adhesive bonding layer. The third chip is connected with the second chip through the second adhesive bonding layer, wherein the first thermal via is extended to penetrate the second adhesive bonding layer.

In an embodiment of the invention, the three-dimensional integrated circuit further includes a second thermal via. The second thermal via penetrates the second chip and the third chip and is located in a portion of the inter-stratum thermal pad.

In an embodiment of the invention, the second thermal via penetrates and extends to the first chip.

In an embodiment of the invention, the third chip includes a third element layer, a third metal layer, a third substrate, and a third dielectric layer. The third element layer has a first surface and a second surface opposite to each other. The third metal layer is disposed on the first surface of the third element layer. The third substrate is disposed on the second surface of the third element layer. The third dielectric layer is disposed on the third substrate and located beside the third element layer and the third metal layer.

In an embodiment of the invention, the second chip and the third chip are electrically connected with each other by the through-silicon via technique.

Based on the above, in the three-dimensional integrated circuit of the invention, the inter-stratum thermal pad is embedded in the first adhesive bonding layer, so as to transmit the heat emitted from the hot zone and prevent the heat from being blocked by the first adhesive bonding layer that has low thermal conductivity, thereby improving the thermal conductivity of the first adhesive bonding layer. Additionally, the inter-stratum thermal pad is disposed corresponding to the hot zone. That is, the inter-stratum thermal pad faces right to the hot zone (right under the hot zone, for example), so as to directly transmit the heat emitted from the hot zone, thereby enhancing the overall heat dissipation efficiency of the three-dimensional integrated circuit.

To make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1:
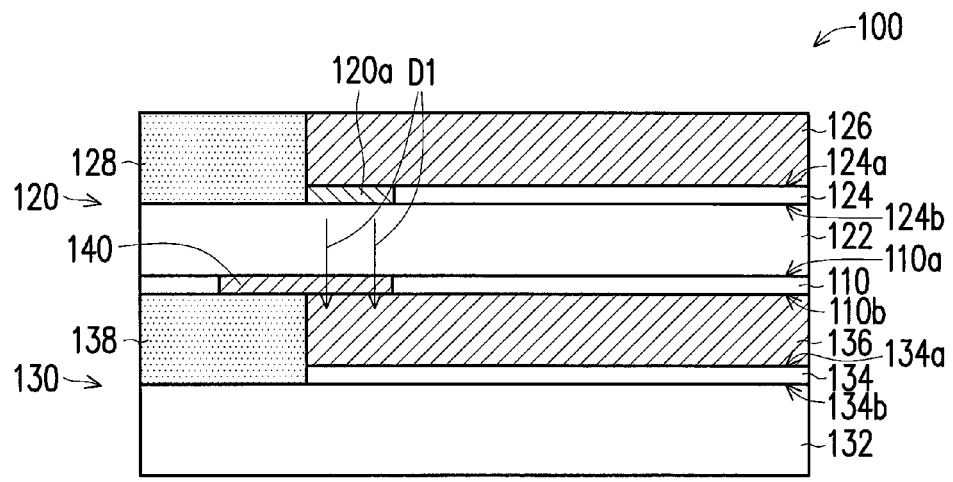
FIG. 1 is a schematic view of a three-dimensional integrated circuit according to an embodiment of the invention.

FIG. 1 is a schematic view of a three-dimensional integrated circuit according to an embodiment of the invention. In the drawings, the thickness of the layers may be enlarged to clearly illustrate the disclosure. Orientations, such as up, down, left, and right, are reference for description of FIG. 1. That is, spatial descriptions, such as over, above, under, below, underneath, etc., are used to illustrate the relationship between one element or characteristic and another element or characteristic, as shown in FIG. 1. It should be understood that the spatial descriptions may include other orientations with respect to the use or operation of the device besides the orientations shown in the drawings.

Referring to FIG. 1, a three-dimensional integrated circuit 100 of this embodiment includes a first adhesive bonding layer 110, a first chip 120, a second chip 130, and an inter-stratum thermal pad 140. It is worth mentioning that a chip stack of the three-dimensional integrated circuit 100 of this embodiment is formed by stacking a plurality of chips. For example, the first chip 120 and the second chip 130 are stacked to form one chip stack, as shown in FIG. 1, wherein the first chip 120 and the second chip 130 are electrically connected with each other through a through-silicon via (TSV) technique. That is to say, power and signals may be transmitted between different chips using different through-silicon via structures. For instance, a function unit (not shown) of the first chip 120 may transmit a signal (or power voltage) to a function unit (not shown) of the second chip 130 through the through-silicon via structure (not shown). Generally speaking, the through-silicon via structure includes a pad and a micro bump, for example. Since the through-silicon via structure is commonly-known technology, details thereof will be omitted hereinafter.

In this embodiment, the first adhesive bonding layer 110 has a first surface 110a and a second surface 110b that are opposite to each other, wherein the first adhesive bonding layer 110 is a polymer-based glue bonding layer or a low thermally conductive bonding layer, for example, and the first chip 120 and the second chip 130 are fixed to each other by the first adhesive bonding layer 110. The first chip 120 is disposed on the first surface 110a of the first adhesive bonding layer 110, and the second chip 130 is disposed under the second surface 110b of the first adhesive bonding layer 110. In other words, the first chip 120 and the second chip 130 are located on two opposite sides of the first adhesive bonding layer 110. The first chip 120 includes a hot zone 120a. The inter-stratum thermal pad 140 is embedded in the first adhesive bonding layer 110 and faces to the hot zone 120a. It is worth mentioning that, in FIG. 1, the width of the inter-stratum thermal pad 140 is slightly greater than the width of the hot zone 120a; however, the disclosure is not intended to restrict the width of the inter-stratum thermal pad 140. The invention only requires the inter-stratum thermal pad 140 to face the hot zone 120a.

With this configuration, in the three-dimensional integrated circuit 100 of the invention, the inter-stratum thermal pad 140 is embedded in the first adhesive bonding layer 110, so as to transmit the heat from the hot zone 120a and prevent the heat from being blocked by the first adhesive bonding layer 110 which has low thermal conductivity, thereby improving the thermal conductivity of the first adhesive bonding layer 110. In addition, the inter-stratum thermal pad 140 is disposed corresponding to the hot zone 120a. That is, the inter-stratum thermal pad 140 faces right to the hot zone 120a (right under the hot zone 120a, for example), so as to directly transmit the heat from the hot zone 120a to the second chip 130, thereby enhancing the overall heat dissipation efficiency of the three-dimensional integrated circuit 100.

To be more specific, the first chip 120 includes a first substrate 122, a first element layer 124, a first metal layer 126, and a first dielectric layer 128. The first element layer 124 has a first surface 124a and a second surface 124b that are opposite to each other, and the hot zone 120a is located in the first element layer 124. The first substrate 122 is a silicon substrate, for example, disposed under the second surface 124b of the first element layer 124, and the first metal layer 126 is disposed above the first surface 124a of the first element layer 124. In other words, the first substrate 122 and the first metal layer 126 are located on two opposite sides of the first element layer 124. The first dielectric layer 128 is, for example, a $SiO_2$ layer disposed on the first substrate 122 and located beside the first element layer 124 and the first metal layer 126.

Likewise, the second chip 130 includes a second substrate 132, a second element layer 134, a second metal layer 136, and a second dielectric layer 138. The second element layer 134 has a first surface 134a and a second surface 134b that are opposite to each other. The second metal layer 136 is disposed on the first surface 134a of the second element layer 134, and the second substrate 132 is a silicon substrate, for example, disposed on the second surface 134b of the second element layer 134. In other words, the second substrate 132 and the second metal layer 136 are located on two opposite sides of the second element layer 134. The second dielectric layer 138 is, for example, a $SiO_2$ layer disposed on the second substrate 132 and located beside the second element layer 134 and the second metal layer 136. However, in this embodiment, the hot zone 120a is disposed in the first element layer 124 of the first chip 122. It goes without saying that the hot zone may be disposed in a different chip (e.g. the second chip) according to the product.

Figure 3:
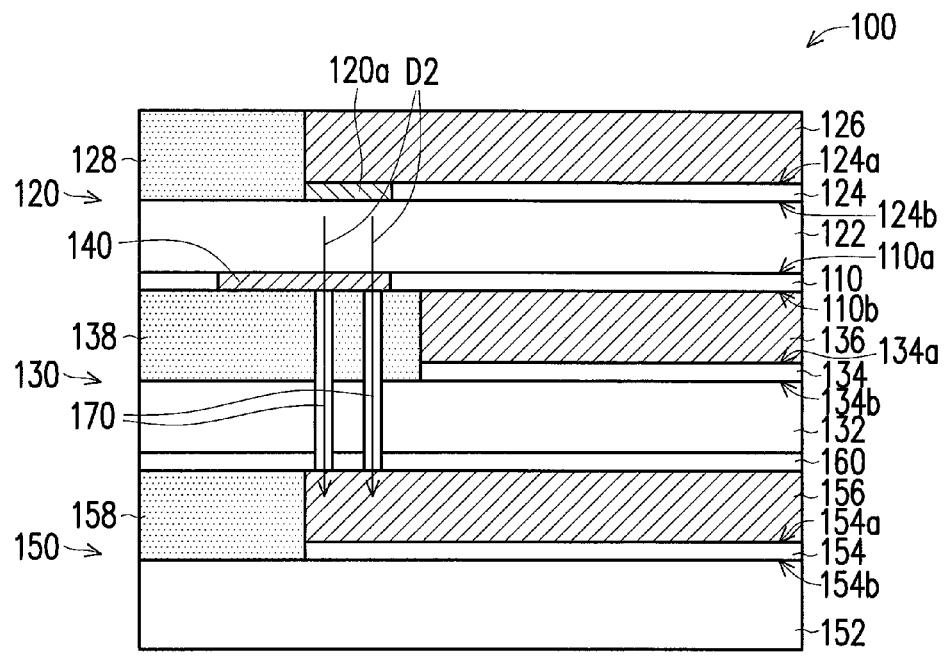
FIG. 3 is a schematic view of a three-dimensional integrated circuit according to yet another embodiment of the invention.
Figure 4:
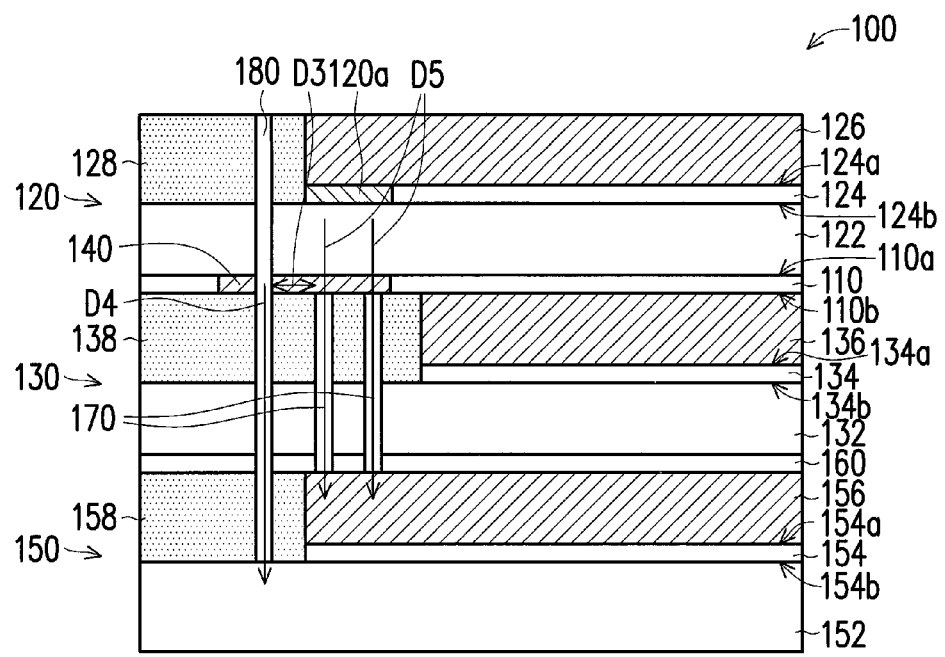
FIG. 4 is a schematic view of a three-dimensional integrated circuit according to yet another embodiment of the invention.
Figure 7:
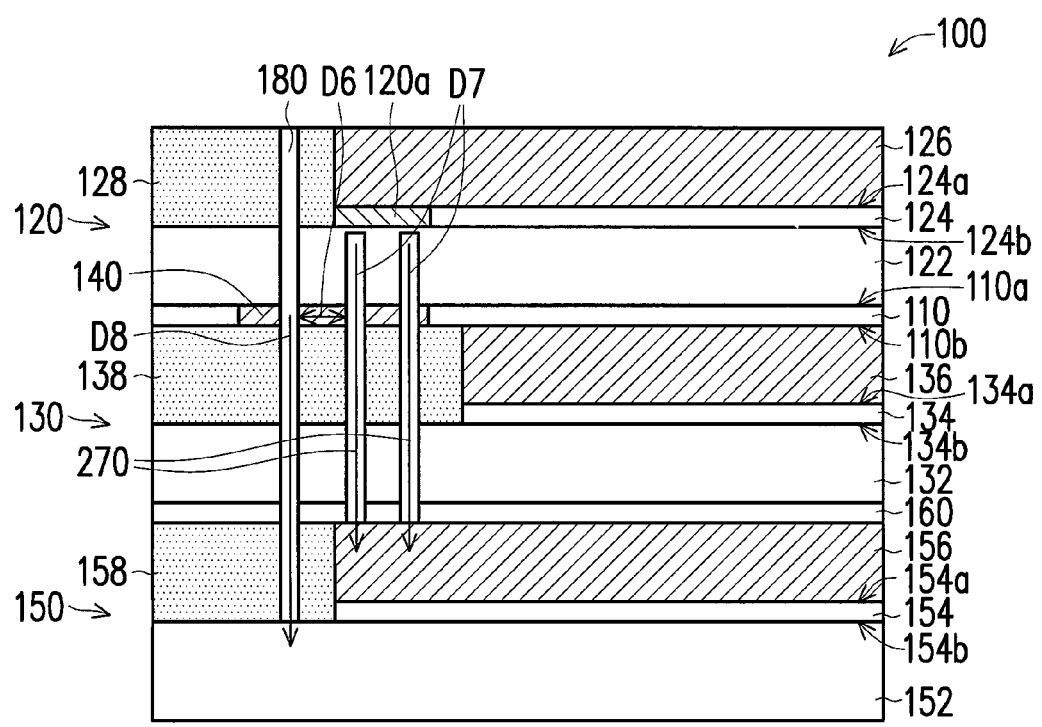
FIG. 7 is a schematic view of a three-dimensional integrated circuit according to yet another embodiment of the invention.

In this embodiment, the inter-stratum thermal pad 140 is made of a thermally conductive metal, such as copper. Furthermore, the inter-stratum thermal pad 140 is made of a material that has a high coefficient in thermal conductivity. The coefficient of thermal conductivity of the material is at least equal to the first substrate 122 of the first chip 120. For example, if silicon is used as the material of the first substrate 122 and a coefficient of thermal conductivity thereof is 150 W/m° C., the coefficient of thermal conductivity of the inter-stratum thermal pad 140 may also be 150 W/m° C., the same as silicon. If another material, such as GaAs, is used as the material of the first substrate 122 and a coefficient of thermal conductivity thereof is 45 W/m° C., the coefficient of thermal conductivity of the inter-stratum thermal pad 140 may also be 45 W/m° C., the same as GaAs. In other words, the inter-stratum thermal pad 140 is made of a material that has a high coefficient in thermal conductivity, which not only solves the problem of low thermal conductivity of the first adhesive bonding layer 110 to transmit the heat from the hot zone 120a but also improves the overall heat dissipation efficiency of the three-dimensional integrated circuit 100. The three-dimensional integrated circuit 100 utilizes the inter-stratum thermal pad 140, which is disposed right under the hot zone 120a. Moreover, since the material of the first substrate 122 of the first chip 120 itself is thermally conductive, the heat emitted from the hot zone 120a is transmitted to the inter-stratum thermal pad 140 through the first substrate 122 and then transmitted to the second metal layer 136 of the second chip 130 through a path of the inter-stratum thermal pad 140, so as to achieve the effect of heat dissipation through vertical thermal conduction (i.e. a heat transmission direction D1 shown in the drawing). It is noted that, in FIG. 1, the width of the second dielectric layer 138 is approximately equal to the width of the first dielectric layer 128; however, the invention is not limited thereto. As shown in FIGS. 3, 4, and 7, the width of the second dielectric layer 138 is greater than the width of the first dielectric layer 128.

Figure 2:
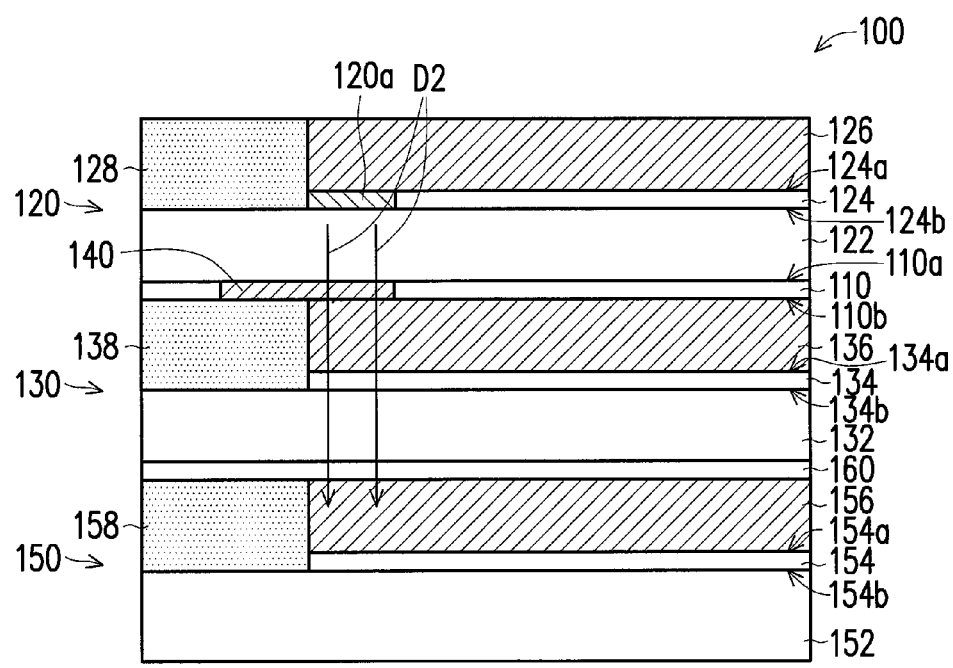
FIG. 2 is a schematic view of a three-dimensional integrated circuit according to another embodiment of the invention.

FIG. 2 is a schematic view of a three-dimensional integrated circuit according to another embodiment of the invention. Referring to FIG. 2, a difference between the embodiments of FIG. 1 and FIG. 2 lies in that: the three-dimensional integrated circuit 100 of this embodiment further includes a third chip 150 and a second adhesive bonding layer 160. The second adhesive bonding layer 160 is a polymer-based glue bonding layer or a low thermally conductive bonding layer, for example, and the third chip 150 and the second chip 130 are connected with each other by the second adhesive bonding layer 160. In this embodiment, the second chip 130 and the third chip 150 are electrically connected with each other by the through-silicon via technique. However, the number of the chips is not restricted to the disclosure of this embodiment. More chips may be stacked according to the requirement of the product.

To be more specific, the third chip 150 includes a third substrate 152, a third element layer 154, a third metal layer 156, and a third dielectric layer 158. The third element layer 154 has a first surface 154a and a second surface 154b that are opposite to each other. The third metal layer 156 is disposed on the first surface 154a of the third element layer 154, and the third substrate 152 is a silicon substrate, for example, disposed on the second surface 154b of the third element layer 154. In other words, the third substrate 152 and the third metal layer 156 are located on two opposite sides of the third element layer 154. The third dielectric layer 158 is, for example, a $SiO_2$ layer disposed on the third substrate 152 and located beside the third element layer 154 and the third metal layer 156. Accordingly, the hot zone 120a is located in the first chip 120, and the heat emitted from the hot zone 120a is transmitted to the second chip 130 through the path of the inter-stratum thermal pad 140 and then transmitted to the third chip 130 to achieve the effect of heat dissipation. It is noted that, in FIG. 2, the width of the second dielectric layer 138 is approximately equal to the width of the first dielectric layer 128; however, the invention is not limited thereto. As shown in FIGS. 3, 4, and 7, the width of the second dielectric layer 138 is greater than the width of the first dielectric layer 128.

FIG. 3 is a schematic view of a three-dimensional integrated circuit according to yet another embodiment of the invention. Referring to FIG. 3, a difference between the embodiment of FIG. 3 and the embodiments of FIGS. 1-2 lies in that: the three-dimensional integrated circuit 100 of this embodiment further includes at least one first thermal via 170 (two are shown in the drawing), which is disposed to face to the hot zone 120a. It should be noted that, different from the through-silicon via structure, the first thermal via 170 only provides a path for heat transmission and is not required to provide electrical connection. Therefore, an insulating material ($SiO_2$) is not required inside the first thermal via 170 for insulation. That is, the insulating material reduces the effect of heat transmission. Thus, the first thermal via 170, which only provides the path for heat transmission, enhances the effect of heat transmission.

More specifically, each first thermal via 170 penetrates the first adhesive bonding layer 110 and the second chip 130, and the first thermal via 170 is located in a portion of the inter-stratum thermal pad 140. The first thermal via 170 is extended to penetrate the second adhesive bonding layer 160. That is to say, the first thermal via 170 penetrates the second chip 130 and the second adhesive bonding layer 160 from the inter-stratum thermal pad 140 and is connected to the third chip 150. Accordingly, the heat emitted from the hot zone 120a is transmitted to the inter-stratum thermal pad 140 through the first substrate 122 and then transmitted to the second chip 130 and the third chip 150 through the path of the first thermal via 170, so as to achieve the effect of heat dissipation through vertical thermal conduction (i.e. a heat transmission direction D2 shown in the drawing).

FIG. 4 is a schematic view of a three-dimensional integrated circuit according to yet another embodiment of the invention. Referring to FIG. 4, a difference between the embodiment of FIG. 4 and the embodiments of FIGS. 1-3 lies in that: the three-dimensional integrated circuit 100 of this embodiment further includes a second thermal via 180. The second thermal via 180 penetrates the second chip 130 and the third chip 150, and is located in a portion of the inter-stratum thermal pad 140.

With this configuration, the heat emitted from the hot zone 120a is transmitted to the inter-stratum thermal pad 140 through the first substrate 122 and then transmitted to the first thermal via 170 and the second thermal via 180 through the inter-stratum thermal pad 140, so as to achieve the effect of heat dissipation through horizontal thermal conduction (i.e. a heat transmission direction D3 shown in the drawing). Moreover, the heat is further transmitted to the second chip 130 and the third chip 150 through the paths of the first thermal via 170 and the second thermal via 180, so as to achieve the effect of heat dissipation through vertical thermal conduction (i.e. heat transmission directions D4 and D5 shown in the drawing). Accordingly, this embodiment utilizes the inter-stratum thermal pad 140 to adjust and dissipate heat to different first thermal via 170 and second thermal via 180. Since there are more heat dissipation paths and the total area of heat dissipation is increased, the heat dissipation efficiency of the three-dimensional integrated circuit 100 is improved.

In addition, the second thermal via 180 further penetrates and extends to the first chip 120. That is, the second thermal via 180 penetrates the first chip 120, the second chip 130, and the third chip 150 to achieve better heat dissipation. The second thermal via 180 extends from the first dielectric layer 128 and penetrates the second dielectric layer 138 and the third dielectric layer 158. Nevertheless, the position of the second thermal via 180 may be varied according to the requirement of the product.

Figure 5:
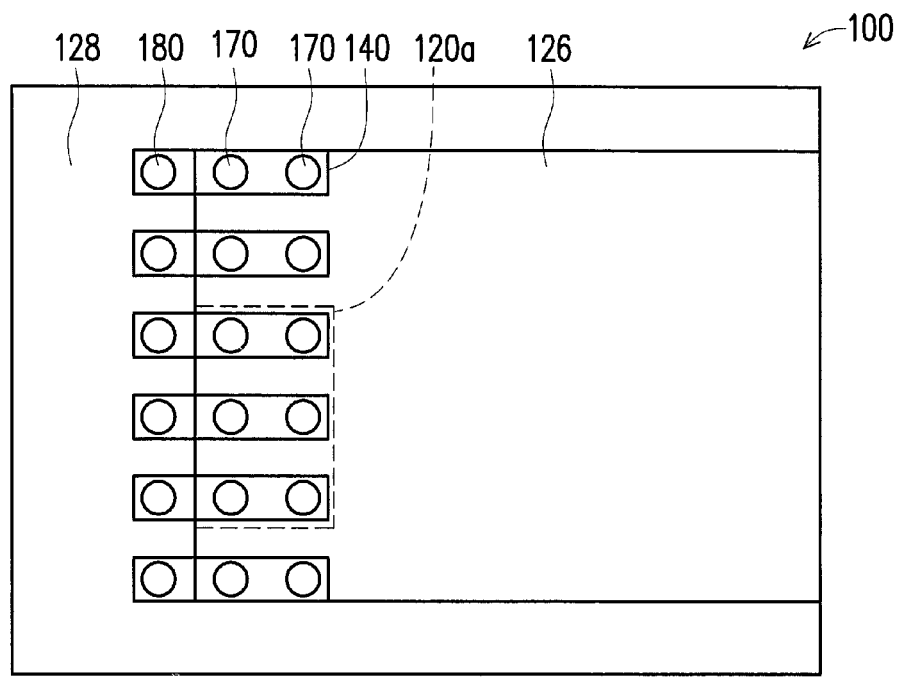
FIG. 5 is a schematic top view of the three-dimensional integrated circuit of FIG. 4.

FIG. 5 is a schematic top view of the three-dimensional integrated circuit of FIG. 4. It should be noted that, for the purpose of clear illustration, a partial area of the first metal layer 126 is made transparent to show the hot zone 120a, the first thermal via 170, and the second thermal via 180. Referring to FIG. 5, in this embodiment, two first thermal vias 170 and one second thermal via 180 are arranged in a row and located in one inter-stratum thermal pad 140. The number of the inter-stratum thermal pads 140 is six, for example, and each of the inter-stratum thermal pads 140 has a rectangular shape. However, the disclosure of this embodiment is not intended to limit the number and shape of the inter-stratum thermal pads 140. In addition, although FIG. 5 does not illustrate the through-silicon via structure, the through-silicon via structure may be disposed according to the actual requirement so as to electrically connect the chips.

Figure 6:
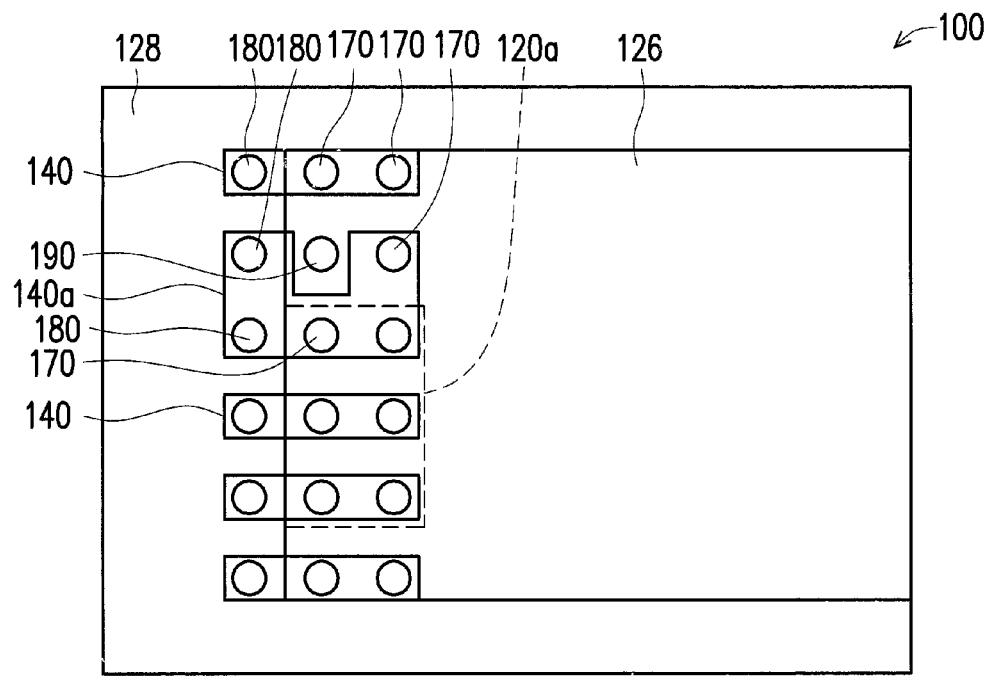
FIG. 6 is a schematic top view of the three-dimensional integrated circuit of FIG. 4 according to another embodiment.

FIG. 6 is a schematic top view of the three-dimensional integrated circuit of FIG. 4 according to another embodiment. Referring to FIG. 6, a difference between the embodiments of FIG. 5 and FIG. 6 lies in that: the three-dimensional integrated circuit 100 of this embodiment further includes a through-silicon via 190. That is, the through-silicon via 190 is disposed in the three-dimensional integrated circuit 100, and thus a circuit or winding, etc., is equipped for the electrical connection between the chips (i.e. the first chip 120, the second chip 130, and the third chip 150). However, the disclosure of this embodiment is not intended to limit the position or the number of the through-silicon via, which may be varied according to the requirement of the product.

With this configuration, the shape of the inter-stratum thermal pad 140 may be varied corresponding to the position of the through-silicon via 190, i.e. the requirements of floorplanning, placement, and routing of the circuit. As shown in FIG. 6, an inter-stratum thermal pad 140a covers two rows of the first thermal vias 170 and second thermal vias 180 and excludes the through-silicon via 190. Of course, the disclosure of this embodiment is not intended to limit the shape of the inter-stratum thermal pad 140, which may be adjusted according to the position and the number of the through-silicon via and the requirement of the product.

FIG. 7 is a schematic view of a three-dimensional integrated circuit according to yet another embodiment of the invention. Referring to FIG. 7, a difference between the embodiment of FIG. 7 and the embodiments of FIGS. 1-4 lies that: in this embodiment, a first thermal via 270 penetrates the first substrate 122 and is located near the hot zone 120a. That is, the first thermal via 270 penetrates the first chip 120, the second chip 130, and the second adhesive bonding layer 160.

With this configuration, the heat emitted from the hot zone 120a is transmitted to the inter-stratum thermal pad 140 through the first thermal via 270 and then transmitted to the first thermal via 270 and the second thermal via 180 in the second chip 130 through the inter-stratum thermal pad 140, so as to achieve the effect of heat dissipation through horizontal thermal conduction (i.e. a heat transmission direction D6 shown in the drawing). Moreover, the heat is further transmitted to the second chip 130 and the third chip 150 through the paths of the first thermal via 270 and the second thermal via 180, so as to achieve the effect of heat dissipation through vertical thermal conduction (i.e. heat transmission directions D7 and D8 shown in the drawing). Accordingly, this embodiment dissipates the heat emitted from the hot zone 120a through the first thermal via 270 by extending the first thermal via 270 and disposing the first thermal via 270 near the hot zone 120a, thereby improving heat dissipation efficiency. Of course, some heat emitted from the hot zone 120a may be transmitted to the inter-stratum thermal pad 140 through the first substrate 122.

In conclusion of the above, the three-dimensional integrated circuit of the invention is designed to embed the inter-stratum thermal pad in the first adhesive bonding layer, so as to transmit the heat emitted from the hot zone and prevent the heat from being blocked by the first adhesive bonding layer that has low thermal conductivity, thereby improving the thermal conductivity of the first adhesive bonding layer. Additionally, the inter-stratum thermal pad is disposed corresponding to the hot zone. That is, the inter-stratum thermal pad faces right to the hot zone (right under the hot zone, for example), so as to directly transmit the heat emitted from the hot zone, thereby enhancing the overall heat dissipation efficiency of the three-dimensional integrated circuit.

The three-dimensional integrated circuit further includes a plurality of thermal vias, and the heat is transmitted to different thermal vias through the inter-stratum thermal pad, so as to achieve the effect of heat dissipation through horizontal thermal conduction. Moreover, the heat is transmitted to the second chip and the third chip through the paths of the thermal vias, so as to achieve the effect of heat dissipation through vertical thermal conduction. Based on the above, the invention utilizes the inter-stratum thermal pad to adjust and dissipate heat to different thermal vias, so as to increase the total area of heat dissipation and the heat dissipation paths, thereby enhancing the heat dissipation efficiency.

It will be apparent to those skilled in the art that various modifications and variations can be made to the disclosed embodiments without departing from the scope or spirit of the invention. In view of the foregoing, it is intended that the invention covers modifications and variations of this disclosure provided that they fall within the scope of the following claims and their equivalents.

What is claimed is:
1. A three-dimensional integrated circuit, comprising:
 a first adhesive bonding layer comprising a first surface and a second surface opposite to each other;
 a first chip disposed on the first surface of the first adhesive bonding layer and comprising a hot zone;

a second chip disposed on the second surface of the first adhesive bonding layer; and an inter-stratum thermal pad embedded in the first adhesive bonding layer and facing to the hot zone.

2. The three-dimensional integrated circuit according to claim 1, wherein a material of the inter-stratum thermal pad comprises a material that has a high coefficient of thermal conductivity, which is at least equal to a coefficient of thermal conductivity of a first substrate of the first chip.

3. The three-dimensional integrated circuit according to claim 1, wherein the material of the inter-stratum thermal pad comprises copper.

4. The three-dimensional integrated circuit according to claim 1, further comprising:

at least one first thermal via penetrating the first adhesive bonding layer and the second chip and located in a portion of the inter-stratum thermal pad.

5. The three-dimensional integrated circuit according to claim 4, wherein the at least one first thermal via is disposed to face right to the hot zone.

6. The three-dimensional integrated circuit according to claim 4, wherein the first chip comprises:

a first substrate penetrated by the at least one first thermal via that is located near the hot zone.

7. The three-dimensional integrated circuit according to claim 6, wherein the first chip further comprises:

a first element layer comprising a first surface and a second surface opposite to each other, wherein the hot zone is located in the first element layer, and the first substrate is disposed on the second surface of the first element layer;

a first metal layer disposed on the first surface of the first element layer; and a first dielectric layer disposed on the first substrate and located beside the first element layer and the first metal layer.

8. The three-dimensional integrated circuit according to claim 1, wherein the second chip comprises:

a second element layer comprising a first surface and a second surface opposite to each other;

a second metal layer disposed on the first surface of the second element layer;

a second substrate disposed on the second surface of the second element layer; and a second dielectric layer disposed on the second substrate and located beside the second element layer and the second metal layer.

9. The three-dimensional integrated circuit according to claim 1, wherein the first chip and the second chip are electrically connected with each other by a through-silicon via technique.

10. The three-dimensional integrated circuit according to claim 4, further comprising:

a third chip; and a second adhesive bonding layer connecting the third chip with the second chip, wherein the at least one first thermal via is extended to penetrate the second adhesive bonding layer.

11. The three-dimensional integrated circuit according to claim 10, further comprising:

a second thermal via penetrating the second chip and the third chip and located in a portion of the inter-stratum thermal pad.

12. The three-dimensional integrated circuit according to claim 10, wherein the second thermal via penetrates and extends to the first chip.

13. The three-dimensional integrated circuit according to claim 10, wherein the third chip comprises:

a third element layer comprising a first surface and a second surface opposite to each other;

a third metal layer disposed on the first surface of the third element layer;

a third substrate disposed on the second surface of the third element layer; and a third dielectric layer disposed on the third substrate and located beside the third element layer and the third metal layer.

14. The three-dimensional integrated circuit according to claim 10, wherein the second chip and the third chip are electrically connected with each other by the through-silicon via technique.

* * * * *